United States Patent [19]

Shibata

[11] Patent Number: 4,500,905

[45] Date of Patent: Feb. 19, 1985

[54] STACKED SEMICONDUCTOR DEVICE WITH SLOPING SIDES

[75] Inventor: Tadashi Shibata, Yokohama, Japan

[73] Assignee: Tokyo Shibaura Denki Kabushiki Kaisha, Kawasaki, Japan

[21] Appl. No.: 425,513

[22] Filed: Sep. 28, 1982

[30] Foreign Application Priority Data

Sep. 30, 1981 [JP] Japan .................................. 56-155126
Sep. 30, 1981 [JP] Japan .................................. 56-155127

[51] Int. Cl.³ .......................................... H01L 23/48
[52] U.S. Cl. ........................................ 357/68; 357/40;
357/41; 357/55; 357/56
[58] Field of Search ............... 357/68, 40, 55, 41, 357/56, 76

[56] References Cited

U.S. PATENT DOCUMENTS

| 3,447,235 | 6/1969 | Rosvold et al. | 357/40 X |
| 4,046,594 | 9/1977 | Tarvi et al. | 357/55 X |
| 4,290,077 | 9/1981 | Ronen | 357/56 X |

FOREIGN PATENT DOCUMENTS

| 0038278 | 4/1978 | Japan | 357/41 |
| 0143059 | 11/1980 | Japan | 357/40 |
| 0015455 | 1/1982 | Japan | 357/40 |

OTHER PUBLICATIONS

Goeloe et al., "Vertical Single-Gate CMOS Inverters on Laser-Processed Multilayer Substrates," Lincoln Lab., Mass. Inst. of Tech., Lexington, Mass., 1981, pp. 554-556.
Bodendorf et al., "Active Silicon Chip Carrier," *IBM Technical Disclosure Bulletin*, vol. 15, No. 2, Jul. 1972, p. 656.

Primary Examiner—Andrew J. James
Assistant Examiner—William A. Mintel
Attorney, Agent, or Firm—Oblon, Fisher, Spivak, McClelland & Maier

[57] ABSTRACT

Provided is a stacked semiconductor device wherein a plurality of semiconductor layers integrated with semiconductor elements are stacked with an insulating layer interposed between two adjacent of said semiconductor layers. This semiconductor device has one or more inclined faces extending over two or more of said semiconductor layers. These inclined faces are formed thereon with an interconnection layer or semiconductor element for effecting the transmission and reception of signals between circuits, having said semiconductor elements, formed in the different semiconductor layers, through another insulating layer.

3 Claims, 10 Drawing Figures

STACKED SEMICONDUCTOR DEVICE WITH SLOPING SIDES

BACKGROUND OF THE INVENTION

This invention relates to a semiconductor device wherein a plurality of semiconductor layers each formed with a semiconductor element or elements are stacked. More particularly, the invention is concerned with the technique of signal transmission between the semiconductor layers of such a semiconductor device.

The degree of integration in a semiconductor integrated circuit has in recent years been increased to a remarkable extent. Particularly, remarkable progress in the technique of minute fabrication has made it possible to easily form an element or wiring whose minimum dimension is approximately 1 $\mu$m. Further, for the purpose of increasing the degree of integration, not only integration of semiconductor elements on one semiconductor substrate but also the development of what is called a "three dimensional IC", wherein the semiconductor layer formed with said elements is stacked two or more in number, has recently been made on a popular basis. One of the basic problems in connection with such a three-dimensional IC occurs with the signal transmission between the circuits respectively formed in different semiconductor layers. That is, many problems have arisen in connection with the formation of interconnection for transmitting a signal processed by a circuit formed in a semiconductor layer to a circuit formed in another semiconductor layer.

The problem having occurred with the above-mentioned prior art three-dimensional IC will now briefly be explained with reference to FIG. 1. FIG. 1 is a sectional view showing, in simplified form, the interconnections between the different semiconductor layers of a three-dimensional IC. In FIG. 1, the drain 12 of an MOS transistor formed in the n-th semiconductor layer 11 is electrically connected by a conductor 17 to the source 14 of an MOS transistor formed in the (n+1)th semiconductor layer 13. For example, data processed by a circuit in the n-th semiconductor layer 11 is selected by a selective gate 15 and is outputted from the drain 12. The data outputted is transmitted through the conductor 17 to the source 14 of the MOS transistor formed in the (n+1)th semiconductor layer. The signal, further, is selected by a selective gate 18 and outputted to enter a circuit formed in the semiconductor layer 13, in which it is subjected to signal processing.

In manufacturing the three-dimensional integrated circuit explained above, after the formation of the integrated circuit in the n-th semiconductor layer 11, for example, an intervening insulating film 16 consisting of $SiO_2$ is first formed on the semiconductor layer 11 and a through hole is provided in the film 16. Thereafter, the conductor 17 consisting, for example, of a polycrystalline silicon doped with an impurity is filled into the through hole. Thereafter, the (n+1)th semiconductor layer 13 is formed on the intervening insulating film 16 and is formed with an integrated circuit including an MOS transistor. In this case, the source 14 of the MOS transistor thus formed in the (n+1)th semiconductor layer 13 is connected by a diffusion layer 19 to the conductor 17.

In the manufacture of the said three-dimensional integrated circuit, it is difficult to form with a high yield such a fine through hole and further it is also extremely difficult to successfully fill the conductive material into the through hole thus formed. The formation of such a conductor penetrating through the intervening insulating film 16 is particularly difficult for the reason that when, for example, the (n+1)th semiconductor layer 13 is formed by recrystallizing, for example, a polycrystalline semiconductor layer by subjecting the same to laser annealing, it is necessary to form the insulating film 16 to an appreciable great thickness (1~5 $\mu$m) so as to prevent the heat generated due to the laser exposure from having an undesirable effect upon the elements formed in the n-th semiconductor layer 11. Further, for the purpose of preventing the conductor 17 from being deteriorated due to the laser exposure or having undesired reactions with the semiconductor layer 13, a limitation was imposed upon the selection of the material of the conductor 17. That is, the material of the conductor 17 was limited to a polycrystalline silicon, refractory metal or the like having heat resistance and having no reaction with silicon. These problems not only cause a decrease in the manufacturing yield of the three-dimensional IC but also become the causes of obstructing the increase or extension of the function thereof.

FIG. 2 shows an example of the prior art three-dimensional integrated circuit, which is a one chip computer consisting of five layers 21 to 25. The first layer 21 and the second layer 22 are each a RAM having a 1M bit capacity, the third layer 23 is a microprocessor for performing the signal processing, namely CPU (Central Processing Unit), the fourth layer 24 is a 4M bit ROM stored with a program, and the fifth layer 25 as the uppermost layer is a controller having, in addition to the function of controlling the signals supplied to the other layers, the functions of interfacing, performing the sequence processing, etc. To cause the one-chip computer having the above-mentioned construction to function effectively, it is necessary to permit a free transmission and reception of a signal between each of the layers. Particularly, the controller layer 25 is required to make its transmission and reception of a signal to and from each of the other layers at all times. In the three-dimensional IC having such prior art construction or structure, therefore, it is necessary to form a conductor connecting the fifth layer 25 and the first layer 21, that is, to form through holes and fill a conductive material into these through holes. Extreme difficulties are encountered, however, in meeting such a necessity. Further, since a signal is very often transmitted from one layer to another through the controller, a delay in the signal transmission becomes a great problem.

SUMMARY OF THE INVENTION

Accordingly, the object of the invention is to provide a stacked semiconductor device which can make a transmission and reception of a signal between the circuits of different semiconductor layers without using a conductor which is difficult to form and which extends through an insulating layer interposed between each semiconductor layer.

According to one aspect of this invention, there is provided a semiconductor device having a plurality of semiconductor layers each having an integrated circuit which are stacked with an insulating layer interposed between two adjacent semiconductor layers. This device has at least one inclined face defined by the sloping sides of two or more of the semiconductor layers and one or more of the insulating layers interposed therebetween. The inclined face is formed thereon through another insulating layer, with at least one element for effecting the transmission and reception of signals between the integrated circuits formed in the different semiconductor layers. This element is one member selected from the group consisting of an interconnection layer, semiconductor element and controller for the respective integrated circuits of said semiconductor layers.

DETAILED DESCRIPTION OF THE PREFERRED EMBODIMENTS

Figure 1:
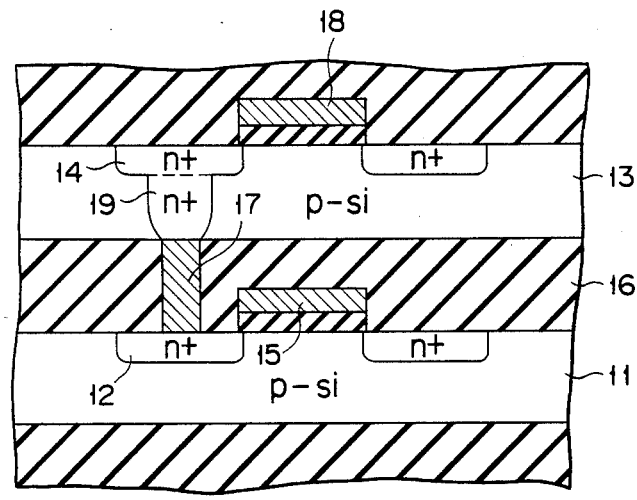
FIG. 1 is a sectional view of a prior art stacked semiconductor device.

In the stacked semiconductor device of the present invention, an interconnection layer or semiconductor element can be used as the element formed on the inclined face of the semiconductor device and intended to effect the transmission and reception of a signal between the circuits each formed in a different semiconductor layer. Where said element is an interconnection layer, the insulating film provided on the inclined face may be thin. Therefore, it is easy to form a contact hole in this insulating film, with the result that the interconnection layer can be formed with a high yield. Since the formation of the interconnection layer may be made after all semiconductor layers have been stacked, the annealing for recrystallization is not carried out thereafter. In particular, a limitation is not therefore imposed upon the material of the interconnection layer. Further, where said element is a semiconductor element, it is also possible with this semiconductor element to effect the signal transmission and reception between the integrated circuits of any given different semiconductor layers. Therefore, the stacked semiconductor device of the invention involving such a semiconductor element is easy to manufacture as compared with a prior art stacked semiconductor device wherein the signal transmission and reception is effected using a conductor vertically extending through the device. Further, the stacked semiconductor device of the invention having such a semiconductor element also has the advantage that the signal delay is small. The formation of the semiconductor element for signal transmission and reception is made by forming an insulating film, such as an $SiO_2$ film, on, for example, the inclined face of the stacked semiconductor device, thereafter depositing a polycrystalline or amorphous semiconductor layer on said insulating film, subsequently irradiating laser beams or electron beams onto the semiconductor layer to recrystallize the semiconductor layer into a single-crystalline semiconductor layer, and forming a desired semiconductor element or elements in this semiconductor layer.

In the exposure process for the formation of such a semiconductor element used to effect the signal transmission and reception, exposure can be carried out in a state wherein a semiconductor wafer is kept so inclined as to permit the inclined face of the stacked semiconductor device to intersect the exposure axis at right angles thereto. Although it is not possible with this exposure process to perform one shot exposure with respect to many inclined faces, it is easy to sequentially perform the exposure operation with respect to each inclined face by moving the semiconductor wafer correspondingly in parallel. Thus, it is possible to form a desired element pattern with high precision with respect to the inclined face as in the case of the upper face of the semiconductor wafer.

Hereinafter, a more detailed explanation of the invention will be made by describing various embodiments thereof with reference to the accompanying drawings. Initially, reference will be made to a case where said element for signal transmission and reception is an interconnection layer.

Figure 3:
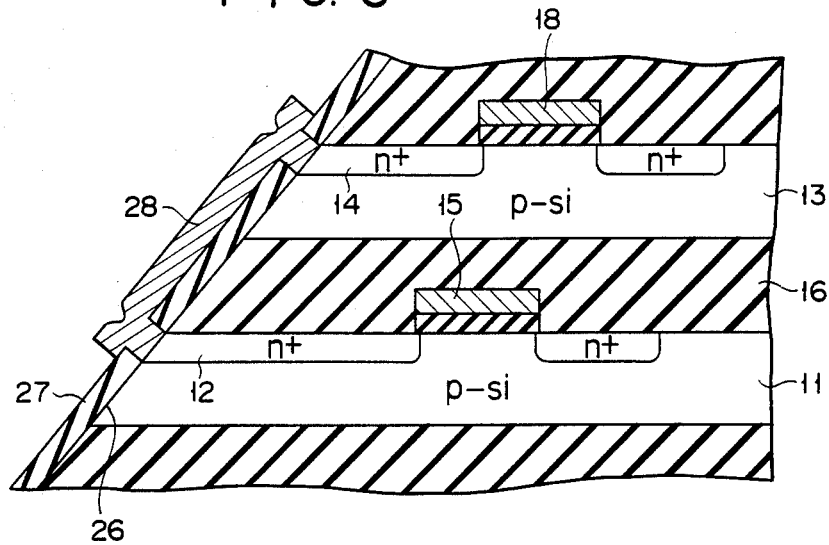
FIG. 3 is a sectional view of a stacked semiconductor device according to an embodiment of the invention.

FIG. 3 shows how the formation of the interconnection layer between the circuits, each of a different semiconductor layer according to the invention, is carried out under the same conditions as in FIG. 1. The corresponding parts and sections of FIG. 3 to those of FIG. 1 are denoted by the same reference numerals as in FIG. 1. Unlike the structure shown in FIG. 1, however, an inclined face 26 defining an angle of $\theta$ ($\theta < 90°$) with respect to the main face of each of the n-th semiconductor layer 11, the (n+1)th semiconductor layer 13 and an insulating layer 16 interposed between the layers 11 and 13, is formed extending over the layers 11, 13 and 16. An insulating layer 27 formed, for example, of $SiO_2$ is provided on the inclined face 26 and, after forming contact holes in the insulating layer 27, an interconnection layer 28 formed, for example of Al is formed on the resulting insulating layer 27. This Al interconnection layer 28 electrically connects a drain 12 of an MOS transistor in the n-th semiconductor layer 11 to a source 14 of an MOS transistor formed in the (n+1)th semiconductor layer 13. The interconnection layer may be formed of aluminum based alloy such as Al-Si, Al-Cu and Al-Cu-Si.

This structure is the same in function as the prior art structure shown in FIG. 1, but it is not necessary to form the insulating layer 27 to such a great thickness as in case of the intervening insulating layer 16. Thus, the formation of the contact holes is very easy and the formation of the interconnection pattern can be made by using the same method as that conventionally carried out on a flat plane, with the result that said formation can be made in an extremely simplified manner and with a high yield. Further, since the formation of such Al interconnection layer may be made after all semiconductor layers have been stacked, this formation is not affected by the irradiation of laser beams or electron beams for the recrystallization of the semiconductor layers, nor is it limited in the selection of the material of the interconnection layer. This is especially convenient.

Figure 4:
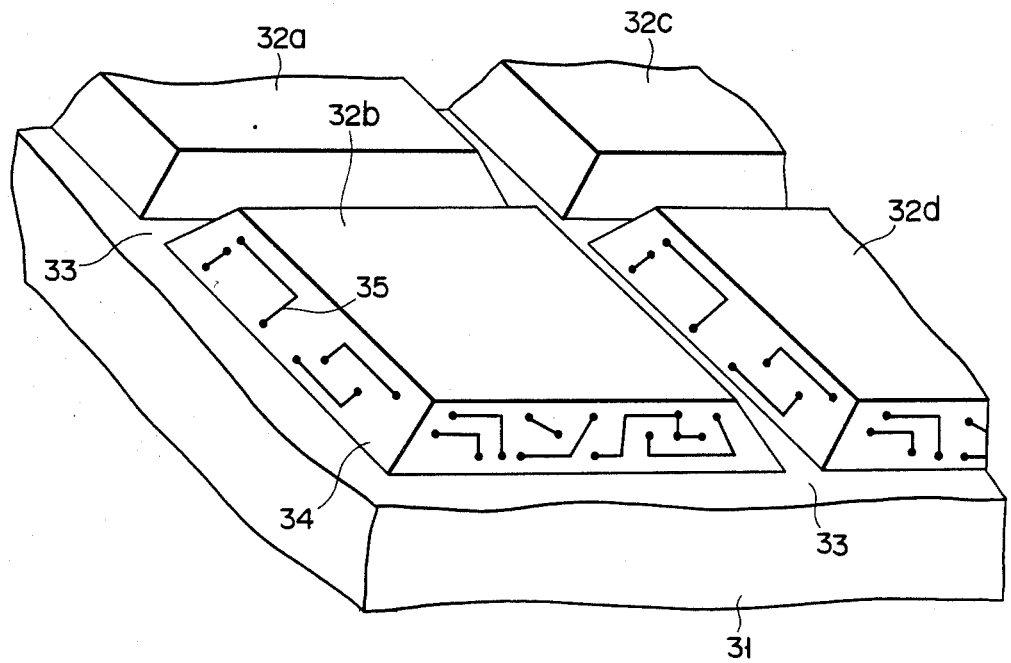
FIG. 4 is a perspective view of a semiconductor wafer formed with inclined faces on the side faces of its semiconductor chips.

FIG. 4 is a perspective view conceptually showing an embodiment of the invention wherein such inclined faces as mentioned above are formed on the side faces of semiconductor chips. The Figure shows the formation of three-dimensional IC chips 32a, 32b, 32c, and 32d wherein two or more semiconductor layers are formed on, for example, a single-crystalline silicon wafer 31. Each chip is the same IC and is separated from another by what is called a "scribe line" 33. In this embodiment, the side faces of each chip 32 extending along the scribe line 33 are formed into the inclined faces 34 inclined with respect to the main face of the corresponding semiconductor layer. On these inclined faces, Al interconnection layers 35 are formed. Further, on the corresponding side faces of the chips, the same pattern is formed.

Since, by forming the chips in the above-mentioned manner, the side faces of the chips not used at all in the prior art can be utilized for interconnection, there is no need to use a superfluous area of the chip to perform the interconnection and at the same time a great advantage is provided in increasing the degree of integration of the chip. Further, the above-mentioned formation of the chip also has a characteristic such that the mass-production of the resultant semicoductor device is easy by using a method which will later be described.

Note here that the interconnection pattern shown in FIG. 4 is simplified for convenience of explanation. Actually, a more complicated fine interconnection can be made to enable a rapid increase in function of the three-dimensional IC. Particularly where a systematic signal processing is collectively carried out in each layer, for example where the first layer is a RAM, the second layer is a micro-processor, and the third layer is a ROM, that is, where the information subjected to signal processing in each layer is delivered from the peripheral portions, the above-mentioned structure of the semiconductor device is extremely effective. Further, the above-mentioned interconnection layer on the inclined faces can also be used to supply power to each layer. Further, it is also possible to provide, on the said inclined faces, a member formed of a material having a high heat conductivity, or a heat dissipation plate formed of such a material, so as to permit dissipation of heat generated from each layer. Further, it is not always necessary to make the same interconnection with respect to the mutually corresponding inclined faces of all chips employed. For example, it is possible by varying the interconnection pattern to alter the function of one chip with respect to that of another chip. Further, the function involving what is called "redundancy" may be added by modifying the finished interconnection in part. That is, a defective element formed in the IC of each layer can be substituted by a substituting element preparatively formed in the same IC, through altering the interconnection pattern on the inclined faces provided externally of the corresponding chip, thereby increasing the manufacturing yield to a great extent. Further, a bonding pad may be provided on the said inclined faces so as to permit signal transmission and reception to and from outside the chip.

Figure 5:
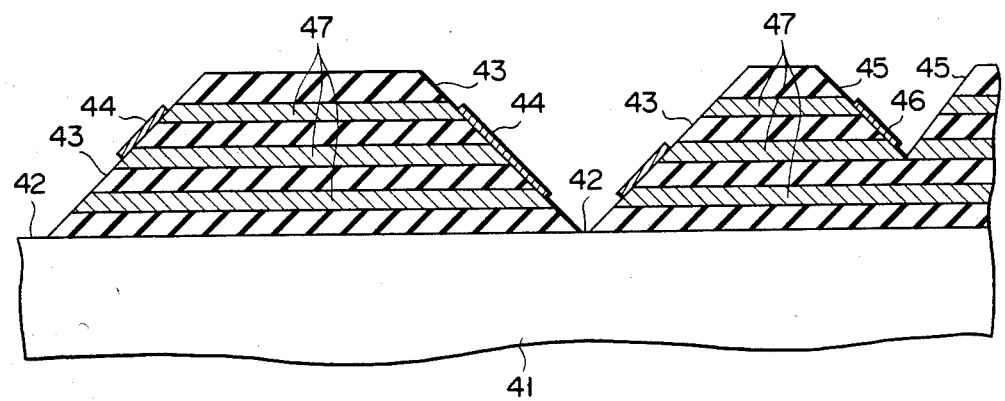
FIG. 5 is a sectional view of a semiconductor wafer formed with inclined faces within its semiconductor chip.

FIG. 5 is a sectional view showing the stacked semiconductor device according to another embodiment of the invention. As in the case of FIG. 4, an Al interconnection layer 44 is formed on the inclined faces 43 of each chip along a scribe line 42 of the wafer 41. In this embodiment, however, inclined faces 45 are formed at a necessary portion within the chip and are also provided with an Al interconnection layer 46. In FIG. 5, reference numeral 47 denotes semiconductor layers formed with active elements. Note here that in FIG. 5 the opposed inclined faces are formed at the same angle, respectively, taken with respect to their corresponding main face portions of the wafer 41. This angle of inclination of such inclined faces may vary from one inclined face to the other. For example, the chip face needing no interconnection can be formed such that $\theta = 90°$, that is, can be formed vertical to the wafer face. By so doing, the proportion of the area occupied by the interconnection applied portions is decreased, thereby increasing the degree of integration. Further, the above-mentioned within-chip interconnection region 46 may be provided in the form of a fine or thin groove like the scribe line, or in the form of a hole.

Figure 6:
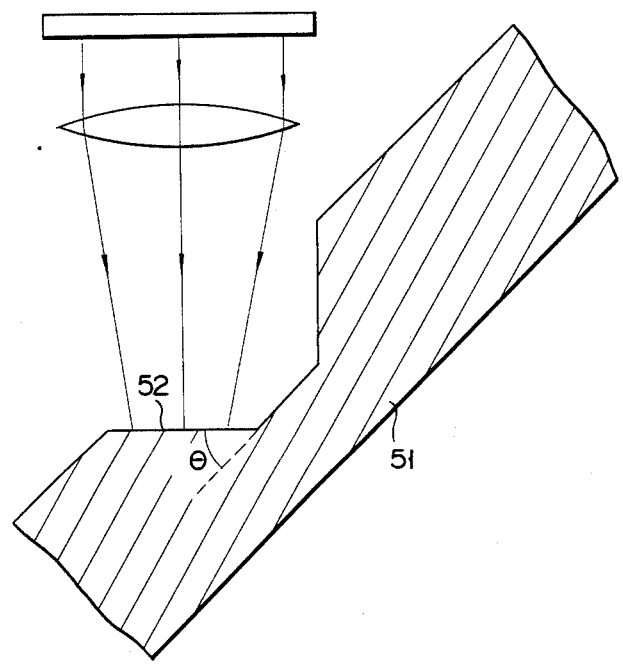
FIG. 6 is a view showing an example of an exposure method of the invention.

FIG. 6 is a view for explaining an example of the manufacturing method for the semiconductor device of the invention. This Figure illustrates how a interconnection pattern is made in the inclined face formed at an angle of $\theta$ with respect to the main face of the wafer 51. That is, by inclining the wafer 51 through the angle of $\theta$, the inclined face 52 is made perpendicular to the optical axis of a reduction projection type exposure, thereby making possible the pattern transfer to the inclined face 52. Upon completion of the exposure transfer with respect to one inclined face, the wafer 51 is moved parallely in a state wherein it is kept inclined at the angle of $\theta$, thereby making it possible to transfer the same pattern to any other inclined face having the same angle of inclination. If, in this case, $\theta \leq 45°$, it is possible, as shown, to prevent part of an adjoining chip from obstructing the pattern transfer. This method of moving horizontally the wafer, kept inclined, may be combined, for example, with a direct electron beam patterning, as well as with the above-mentioned optical patterning. In this case, a mere equipping of a relevant conventional device with a stage permitting the parallel movement of the wafer in a state wherein the wafer is kept inclined makes it possible to perform the electron beam patterning onto the inclined faces. Further, in any case of optical patterning and electron beam patterning, it is possible to construct an exposure apparatus in which to detect the reflected lights, reflected electrons or secondary electrons from each inclined face and detect the angle of inclination of an inclined face desired to undergo the exposure and arrange the inclined face so that it may be automatically made perpendicular to the optical axis. Further, it is also of course possible to allow such an exposure apparatus to perform a mask alignment function.

Figure 7:
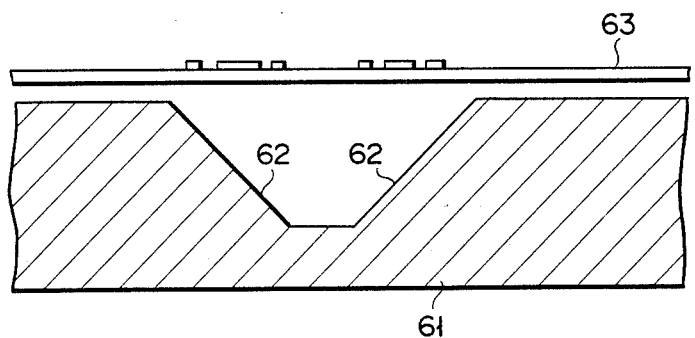
FIG. 7 is a view showing another example of the exposure method of the invention.

FIG. 7 shows one method of effecting one-shot exposure using X-rays with respect to the wafer 61. If, as shown, an X-ray exposure mask 63 is disposed parallel to the main face of the wafer 61 and X-rays are vertically irradiated onto the mask, it is possible, since the depth of focus of X-rays is as great as several $\mu$m, to form an interconnection of fine pattern onto the inclined face 62. This method shown in FIG. 7 does not always require the use of X-rays but may use ultraviolet rays corresponding, for example, to the precision of patterning, the angle of inclination of the inclined face, etc.

In the above-mentioned embodiment, reference was made to the use of Al as an interconnection to be formed on the inclined face, but other conductors or a semiconductor such as that formed of polycrystalline silicon may be used for such an interconnection. Further, the insulating layer to be formed on the inclined face may be a thermally oxidized film, a film formed by the use of the CVD method, or any other film, and may be provided multi-layer.

Next, reference will be made to a case in which said element for signal transmission and reception is a semiconductor element.

Figure 8:
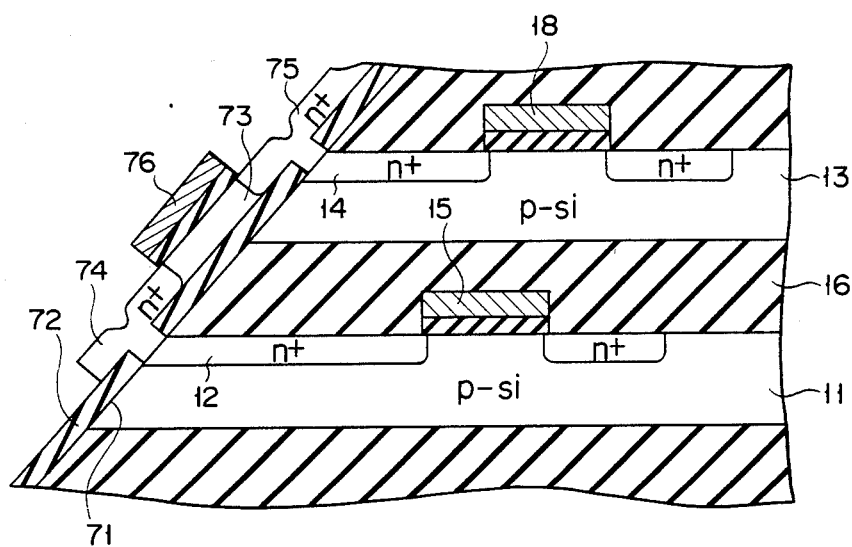
FIG. 8 is a sectional view of the stacked semiconductor device according to another embodiment of the invention.

FIG. 8 shows the stacked semiconductor device according to another embodiment of the invention under the same conditions as in FIG. 1. In the Figure, the corresponding parts and sections to those of FIG. 1 are denoted by the same reference numerals as in the case of FIG. 1. As in FIG. 3, an inclined face defining an angle of $\theta$ ($\theta < 90°$) with respect to the main face of each of the n-th semiconductor layers 11, the (n+1)th semiconductor layer 13 and the insulating layer 16 is formed on the peripheral portion of the chip so that it may extend over those layers 11, 13 and 16. And a semiconductor layer 73 is formed on the inclined face 71 through an insulating layer 72 formed, for example, of $SiO_2$ interposed therebetween and is formed with an MOS transistor having a source 74, a drain 75 and a gate 76. Usable for this semiconductor layer 73 is a material prepared by irradiating laser beams or electron beams onto, for example, polysilicon or amorphous silicon to make a single-crystalline material. The source 74 of this MOS transistor is connected to the source 12 of an MOS transistor formed in the semiconductor layer 71, via a through hole provided in the insulating layer 72, while the drain 75 of said MOS transistor is connected to the drain 14 of an MOS transistor formed in the semiconductor layer 13, via a through hole provided in the insulating layer 72. In this way, the data stored in the n-th layer is selected by the gate 76 to be transmitted to the (n+1)th layer. That is, the data of the n-th layer is not only transmitted to the (n+1)th layer but is selected. As seen from this, the structure according to this embodiment has a greater number of functions than in the prior art.

In the description made above, reference was made, as an example, to a simple case where the MOS transistor serving as a gate element is provided on the inclined face. However, the invention is not limited to such a case but permits providing a more complicated circuit prepared by combining two or more of such transistors. Further, in this embodiment, reference was made to the case where a single semiconductor layer is provided on the inclined face. The invention, however, permits the formation of two or more semiconductor layers to allow the device to have a greater functional capability. Further, in this embodiment, reference was made to the case where the semiconductor layer 73 on the inclined face is provided so as to directly contact the stacked semiconductor layers 11 and 13 via the through hole. The invention, however, permits the use of any other connecting method including a method of connecting the semiconductor layer and the stacked semiconductor layers by means of a separate conductor-wiring. Since in any case the through hole may be provided only in the insulating layer on the inclined face, the formation of the through hole is very easy, resulting in an enhancement of the reliability of the resultant device as well as an increase in the manufacturing yield of the same.

Figure 2:
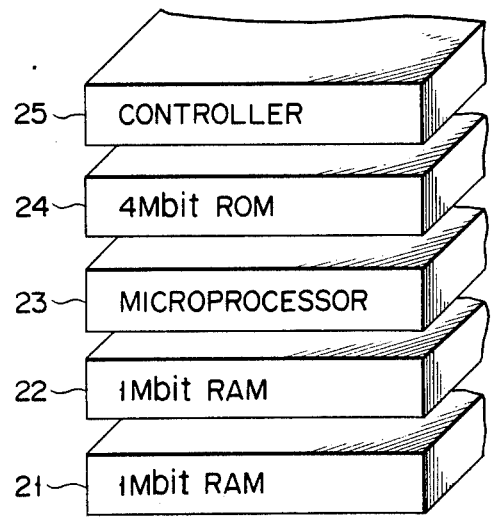
FIG. 2 shows a one chip computer comprised of the prior art stacked semiconductor device.
Figure 9:
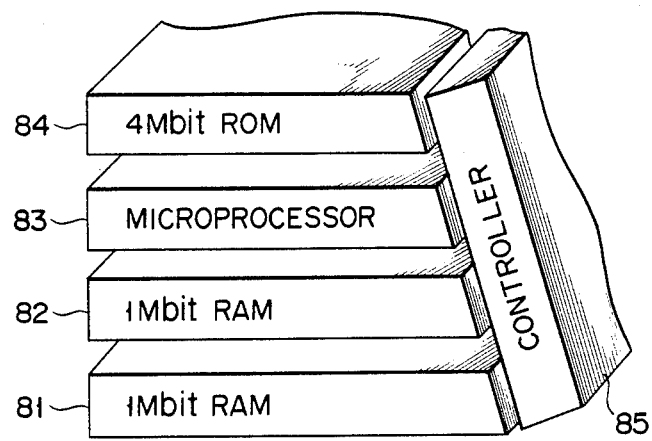
FIG. 9 shows an example of a one chip computer constituted by the stacked semiconductor device of the invention.

FIG. 9 shows an example of a one chip computer corresponding to that of FIG. 2, prepared by using the present invention. In this embodiment, the stacked semiconductor structure is comprised of four layers—a 1M bit RAM layer 81, a 1M bit RAM layer 82, microprocessor layer 83, and 4M bit ROM layer 84, and is additionally formed with a controller layer 85 on the inclined face extending over the said four layers. The signal transmission and reception between the semiconductor layers is totally effected through the interconnection inside the controller layer 45. The signals are additionally processed within the controller layer on an optical basis and can then be transmitted by the same to a desired semiconductor layer. Since, according to this embodiment, it is not necessary, as in the prior art, to transmit the signals to such a desired layer after they have been previously supplied to the uppermost controller layer, high speed operation becomes possible. Further, it is not necessary to provide the through hole in such a manner as to extend, as in the prior art, entirely from the first layer to the fifth layer but it is sufficient to provide a through hole only between the controller layer and each semiconductor layer. As a result, the through hole can be provided with a high yield and with an increase in reliability of the resultant device.

Note here that although in FIG. 9 the controller layer 85 is provided on the inclined face, it may be replaced by a ROM layer, a microprocessor layer, a RAM layer, or a layer having any other function.

Figure 10:
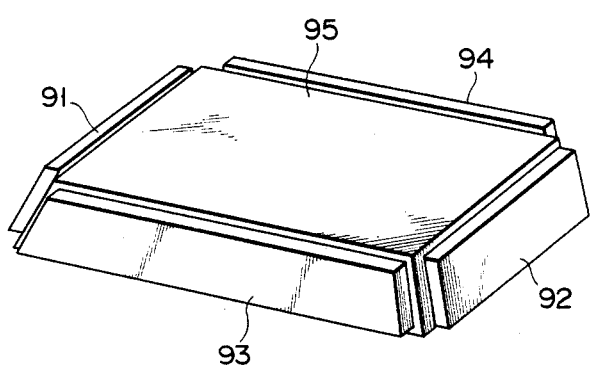
FIG. 10 shows another example of the one chip computer constituted by the stacked semiconductor device of the invention.

Further, it is possible to construct a semiconductor device as shown in FIG. 10, such that inclined faces are formed on the four sides of a quadrilateral chip and are formed thereon with controller layers 91 and 92 and microprocessor layers 93 and 94, and only the RAM and ROM sections are provided within a stacked portion 95. Further, the microprocessor layers, controller layers, etc. may also be suitably provided in the stacked portion if necessary. Further, the configuration of the chip is not limited to the said quadrilateral configuration. For example, it is possible to form the chip into a hexagonal configuration, resulting in an increase in the number of peripheral chip faces, and to make these faces into inclined faces and dispose thereon semiconductor circuits having new functions. Further, by optionally altering the circuits formed on those inclined faces, it is possible to actuallize a three-dimensional IC having different functions almost without altering the other constructions. Further, the inclined faces according to the invention are not limited to those formed on the peripheral chip faces but may be suitably provided within the chip. These inclined faces, when viewed from above, may be formed into a slit configuration like the said scribe line, or may be formed into a hole configuration. Further, the angle of inclination of the inclined faces is not restricted to a specified value but may be suitably changed if necessary.

The patterning performed when the semiconductor circuits are formed on the inclined faces can be effected by a direct application of the method shown in FIGS. 5 and 6 which has been previously explained with respect to the patterning of the above-mentioned interconnection layer.

What is claimed is:
1. A stacked semiconductor device comprising:
a plurality of semiconductor layers each having integrated circuits stacked with an insulating layer interposed between two adjacent of said semiconductor layers, and
which has at least one inclined face defined by the sloping sides of two or more of said semiconductor layers and one or more of said insulating layers interposed therebetween, said inclined face being formed thereon through another insulating layer, with at least one element for effecting the transmission and reception of signals between said integrated circuits formed in the different semiconductor layers, said element being one member selected from the group consisting of an interconnection layer, a semiconductor element and a controller for the respective integrated circuits of said semiconductor layers.

2. The stacked semiconductor device according to claim 1 wherein said element for effecting the transmission and reception of said signals is an interconnection layer and said interconnection layer is formed of aluminum.

3. The stacked semiconductor device according to claim 1 wherein said element of effecting the transmission and reception of said signals is an interconnection layer and said interconnection layer is formed of aluminum based alloy.

* * * * *